(12) United States Patent
Lim et al.

(10) Patent No.: US 7,535,398 B2
(45) Date of Patent: May 19, 2009

(54) CORRELATED DOUBLE-SAMPLING CIRCUIT AND CYCLIC ANALOG-TO-DIGITAL CONVERTER INCLUDING THE SAME

(75) Inventors: Seung-Hyun Lim, Jeonju-si (KR); Jeong-Hwan Lee, Dobong-gu (KR); Gun-Hee Han, Goyang-si (KR); Seog-Hoon Ham, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/872,850

(22) Filed: Oct. 16, 2007

(65) Prior Publication Data
US 2008/0129570 A1    Jun. 5, 2008

(30) Foreign Application Priority Data
Nov. 3, 2006    (KR) ...................... 10-2006-0108516

(51) Int. Cl.
*H03M 1/12* (2006.01)
(52) U.S. Cl. ...................................... 341/155; 341/143
(58) Field of Classification Search .................. 341/143, 341/155
See application file for complete search history.

(56) References Cited

U.S. PATENT DOCUMENTS 6,320,530 B1    11/2001    Horie
7,068,198 B2 *    6/2006    Hong et al. .................. 341/143
2005/0168601 A1    8/2005    Lim
2006/0132341 A1 *    6/2006    Koh et al. .................... 341/143

FOREIGN PATENT DOCUMENTS

| JP | 2001-053610 | 2/2001 |
| JP | 2005136540 A | 5/2005 |
| JP | 2005223918 A | 8/2005 |
| KR | 1020050078898 A | 8/2005 |
| KR | 1020050079729 A | 8/2005 |

* cited by examiner

*Primary Examiner*—Jean B Jeanglaude
(74) *Attorney, Agent, or Firm*—Volentine & Whitt, P.L.L.C.

(57) ABSTRACT

An analog-to-digital converter (ADC) includes first and second circuits, a differential amplifier, a comparator and a digital-to-analog converter (DAC). The first circuit samples a reset voltage, amplifies the sampled reset voltage, and subtracts a first reference voltage from the amplified reset voltage to produce a first difference. The second circuit samples a signal voltage, amplifies the sampled signal voltage, and subtracts a second reference voltage from the amplified signal voltage to produce a second difference. The differential amplifier produces a third difference based a comparison of the first and second differences from the first and second circuits. The comparator compares an output of the differential amplifier with at least one predetermined comparison voltage and outputs a comparison result as a digital value. The DAC is connected to the first and second circuits and the comparator, and controls the first and second reference voltages in response to the digital value.

21 Claims, 9 Drawing Sheets

US 7,535,398 B2

CORRELATED DOUBLE-SAMPLING CIRCUIT AND CYCLIC ANALOG-TO-DIGITAL CONVERTER INCLUDING THE SAME

CROSS-REFERENCE TO RELATED APPLICATIONS

This U.S. non-provisional patent application claims priority under 35 U.S.C. § 119 of Korean Patent Application No. 2006-108516 filed on Nov. 3, 2006, the entire contents of which are hereby incorporated by reference.

BACKGROUND OF THE INVENTION

1. Field of the Invention

The present invention disclosed herein relates to analog-to-digital conversion circuits. More particularly, but not by way of limitation, the invention disclosed herein is concerned with a correlated double-sampling and amplifying circuit for a CMOS image sensor, and a cyclic analog-to-digital converter including such a circuit.

2. Description of the Related Art

A general complementary metal-oxide-semiconductor (CMOS) image sensor (CIS) has an active pixel sensor (APS) array that includes multiple pixels arranged in rows and columns. An analog-to-digital converter (ADC) processes received pixel data, for example data associated with all columns in a selected row of the APS array.

Such an ADC typically includes a correlated double sampling (CDS) circuit. In a CDS operation, an output node is reset to a predetermined reference value, a pixel charge (signal value) is transferred to the output node, and the final value of charge assigned to the pixel is the difference between the reset and signal values. The CDS circuit may also amplify the received reset and signal values, for instance by a factor of two.

A conventional CDS circuit includes multiple capacitors for sampling and amplifying the reset and signal voltages, and a differential amplifier for outputting a difference between the amplified voltages. Three capacitors are typically coupled to each of the inverted and non-inverted input terminals of the differential amplifier. Therefore, in total, the conventional CDS circuit of the ADC includes six capacitors for the CDS operation and amplification of the input signal.

Such circuits are disadvantageous in that the six capacitors occupy a substantial portion of layout area of the CDS circuit, increasing a chip area of the CMOS image sensor. What is needed is a CDS circuit that is more space efficient.

SUMMARY OF THE INVENTION

The invention is directed generally to a correlated double-sampling (CDS) circuit using a smaller number of capacitors than conventional circuits. In embodiments of the invention, a first portion of the CDS circuit uses just two capacitors to sample the reset voltage, amplify the sampled reset voltage, and subtract a first reference voltage from the amplified reset voltage. A second portion of the CDS circuit uses just two capacitors to sample the signal voltage, amplify the sampled signal voltage, and subtract a second reference voltage from the amplified signal voltage. Embodiments of the invention also provide a cyclic analog-to-digital converter (ADC) including the CDS circuit.

In one respect, the invention provides a correlated double-sampling (CDS) circuit. The CDS circuit includes: a first circuit configured to sample a reset voltage, amplify the sampled reset voltage by a factor of two, and subtract a first reference voltage from the amplified reset voltage to produce a first difference; a second circuit configured to sample a signal voltage, amplify the sampled signal voltage by a factor of two, and subtract a second reference voltage from the amplified signal voltage to produce a second difference; and a differential amplifier coupled to the first circuit and the second circuit, the differential amplifier configured to produce a third difference based on a comparison of the first difference and the second difference.

In another respect, the invention provides an analog-to-digital converter (ADC). The ADC includes: a first circuit configured to sample a reset voltage, amplify the sampled reset voltage, and subtract a first reference voltage from the amplified reset voltage to produce a first difference; a second circuit configured to sample a signal voltage, amplify the sampled signal voltage, and subtract a second reference voltage from the amplified signal voltage to produce a second difference; a differential amplifier coupled to the first circuit and the second circuit, the differential amplifier configured to produce a third difference based on a comparison of the first difference and the second difference; a comparator coupled to the differential amplifier, the comparator configured to compare an output of the differential amplifier with at least one predetermined comparison voltage and output a result of the comparison as a digital value; and a digital-to-analog converter (DAC) coupled to the first circuit, second circuit, and comparator, the DAC configured to control the first and second reference voltages in response to the digital value.

A further understanding of the nature and advantages of the present invention herein may be realized by reference to the remaining portions of the specification and the attached drawings.

BRIEF DESCRIPTION OF THE DRAWINGS

Non-limiting and non-exhaustive embodiments of the present invention will be described with reference to the following figures, wherein like reference numerals refer to like parts throughout the various figures unless otherwise specified. In the figures.

DETAILED DESCRIPTION OF PREFERRED EMBODIMENTS

Figure 1:
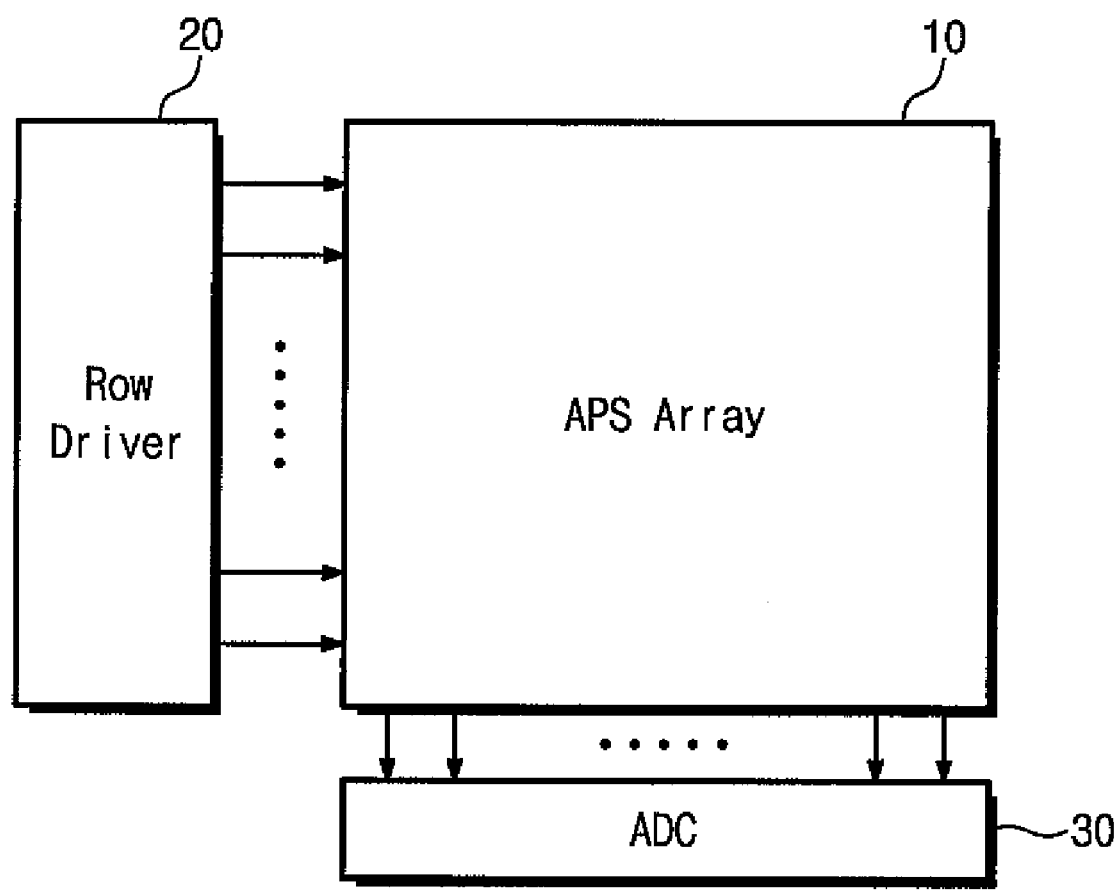
FIG. 1 is a block diagram of a CMOS image sensor, according to an embodiment of the present invention.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Like reference numerals refer to like elements throughout the accompanying figures.

FIG. 1 is a block diagram of a CMOS image sensor according to an embodiment of the present invention.

Referring to FIG. 1, the CMOS image sensor in this embodiment of the present invention includes active pixel sensor (APS) array 10 coupled to a row driver 20 and a cyclic analog-to-digital converter (ADC) 30.

The APS array 10 includes multiple pixels arranged in rows and columns. The ADC 30 may perform an operation of analog-to-digital conversion to all columns for a selected row in the APS array 10. Thus, there may be multiple ADC units coupled to the APS array 10.

The row driver 20 drives a row of the APS array 10 that is selected by a row decoder (not shown). The APS array 10 senses light by means of optical devices, and generates image signals as electric signals corresponding to the sensed light. Image signals output from the APS array 10 are analog signals. The ADC 30 receives the analog signals from the APS array 10, and converts the received analog signals into digital signals. The ADC 30 uses a correlated double-sampling (CDS) mode in converting analog signals into digital signals.

The APS array 10 normally generates a reset voltage before outputting an analog signal sensed by the optical device. The reset voltage is applied to the ADC circuit 30. After generating the reset voltage, the APS array 10 generates an analog voltage (hereinafter, referred to as 'signal voltage') sensed by the optical device. The signal voltage is also applied to the ADC 30.

Figure 2:
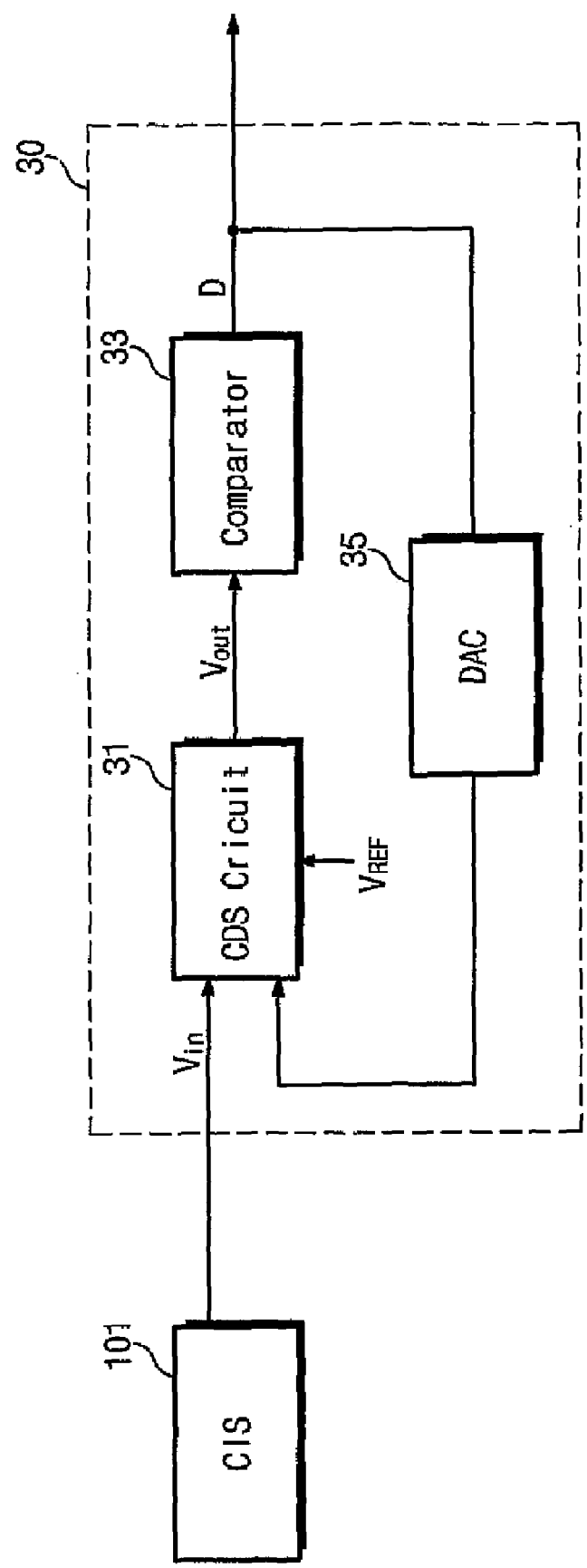
FIG. 2 is a block diagram of the cyclic ADC shown in FIG. 1, according to an embodiment of the present invention.

FIG. 2 is a block diagram of the cyclic ADC shown in FIG. 1, according to an embodiment of the present invention.

Referring to FIG. 2, the ADC 30 includes a CDS circuit 31 coupled to a comparator 33 and a digital-to-analog converter (DAC) 35. The CDS circuit 31 is configured to amplify components of the input signal $V_{IN}$ by a factor of two, and perform a CDS operation on the amplified input signal. The comparator 33 is configured to convert an output $V_{OUT}$ of the CDS circuit 31 into a digital value D. The DAC 35 is configured to output a reference voltage to the CDS circuit 31 in response to the digital value D output from the comparator 33.

The input signal $V_{IN}$ includes the reset voltage Vrst and the signal voltage Vsig. The reset and signal voltages Vrst and Vsig, are input to the CDS Circuit 31 in sequence. The CDS circuit 31 includes first through fourth capacitors ($C_{1P}$, $C_{2P}$, $C_{1M}$, and $C_{2M}$ in FIG. 3). The reset voltage Vrst is sampled through the first and second capacitors, while the signal voltage Vsig is sampled through the third and fourth capacitors. The CDS circuit 31 then amplifies each of the reset and signal voltages Vrst and Vsig by a factor of two, and performs a CDS operation on the amplified reset and signal voltages Vrst and Vsig.

In performing the CDS operation, the CDS circuit 31 subtracts a reference voltage $V_{REF}$ from each of the amplified signals. The reference voltage $V_{REF}$ may be any one of three reference voltages ($V_{RP}$, $V_{RN}$, or GND in FIG. 3). The first reference voltage is a positive value Vref ($V_{RP}$ in FIG. 3), the second reference voltage is a negative voltage −Vref ($V_{RN}$ in FIG. 3), and the third reference voltage is a ground voltage GND.

The comparator 33 converts the output signal Vout into a digital signal D by comparing the output signal Vout with a predetermined comparison voltage. The digital signal D output from the comparator 33 has two components, D0 and D1. The comparator 33 divides a voltage range, which is provided for comparison with Vout, into three regions: the first is ranged from the negative reference voltage −Vref to a comparison voltage−Vref/4; the second is ranged from the comparison voltage −Vref/4 to a comparison voltage Vref/4; and the third is ranged from the comparison voltage Vref/4 to the positive reference voltage Vref. The three voltage regions are allocated with digital codes −1, 0, and 1, respectively.

The relations among the input signal Vout and the digital values D, D0, and D1 are given by Equation 1.

where $Vout > Vref/4$, then $D1=1, D0=0$, and $D=1$;

where $Vref/4 \geq Vout \geq -Vref/4$, then $D1=0, D0=0$, and $D=0$; and where $Vout < -Vref/4$, then $D1=0, D0=1$, and $D=-1$.  [Equation 1]

The digital value D is provided to an external storage unit (not shown) and the DAC 35. The DAC 35 provides analog reference voltages to the CDS circuit 31 in response to the digital value D (hereinafter detailed with reference to FIG. 9).

The CDS circuit 31 thus processes the reset and signal voltages Vrst and Vsig and receives feedback from the DAC 35. If the number of bits of the external storage unit (not shown) storing the digital signal output from the comparator 33 is N+1, the CDS 31 repeats the sampling and amplifying operations N times.

Figure 3:
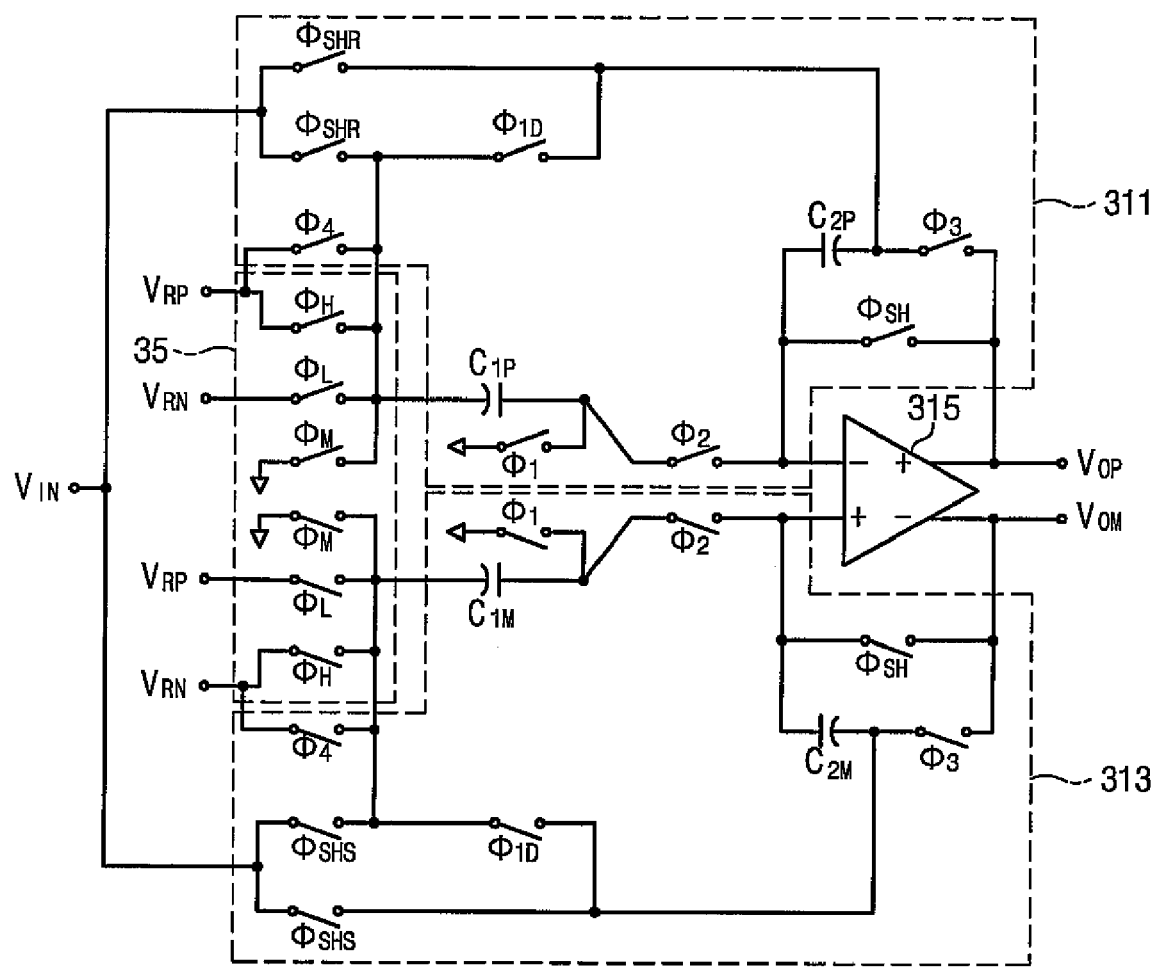
FIG. 3 is a circuit diagram of the correlated double-sampling circuit shown in FIG. 2, according to an embodiment of the present invention.

FIG. 3 is a circuit diagram of the correlated double-sampling circuit shown in FIG. 2, according to an embodiment of the present invention.

Referring to FIG. 3, the CDS circuit 31 includes a first CDS circuit 311 and a second CDS circuit 313, each coupled to a differential amplifier 315.

The first CDS circuit 311 includes a first capacitor $C_{1P}$, a second capacitor $C_{2P}$, and switches $\phi_{SHR}$, $\phi_{1D}$, $\phi_1$, $\phi_2$, $\phi_3$, $\phi_{SH}$, $\phi_4$. The second CDS circuit 313 includes a third capacitor $C_{1M}$, a fourth capacitor $C_{2M}$, and switches $\phi_{SHS}$, $\phi_{1D}$, $\phi_1$, $\phi_2$, $\phi_3$, $\phi_{SH}$, $\phi_4$. The first through fourth capacitors $C_{1P}$, $C_{2P}$, $C_{1M}$, and $C_{2M}$ each have the same capacitance value. The first and second CDS circuits 311 and 313 each receive the input signal $V_{IN}$ and the reference voltage $V_{REF}$. The input signal $V_{IN}$ includes the reset and signal voltages Vrst and Vsig. The reference voltage $V_{REF}$ includes the first reference voltage Vref (=$V_{RP}$), the second reference voltage−Vref (=$V_{RN}$), and the third reference voltage GND that is the ground voltage. The CDS circuit 31 conducts the sampling, amplifying, and CDS operations in response to the input signal $V_{IN}$ and the reference voltage $V_{REF}$.

The switch $\phi_4$ is controlled by an external independent control logic unit (not shown), being turned on to provide the first and second reference voltages $V_{RP}$ and $V_{RN}$ to the CDS circuit 31 when the sampled reset and signal voltages Vrst and Vsig are amplified from the CDS circuit 31.

The DAC 35 includes switches $\phi_H$, $\phi_L$, and $\phi_M$. The first, second, and third reference voltages, $V_{RP}$, $V_{RN}$, and GND, are determined by on/off conditions of the switches $\phi_H$, $\phi_L$, and $\phi_M$.

The switches $\phi_{SHR}$, $\phi_{SHS}$, $\phi_1$, $\phi_{1D}$, $\phi_2$, $\phi_3$, $\phi_{SH}$, $\phi_4$, $\phi_H$, $\phi_L$, and $\phi_M$ each have two poles. Moreover, the status of each of these switches influences the operation of both circuits (311 and 313) as described below.

Figure 4:
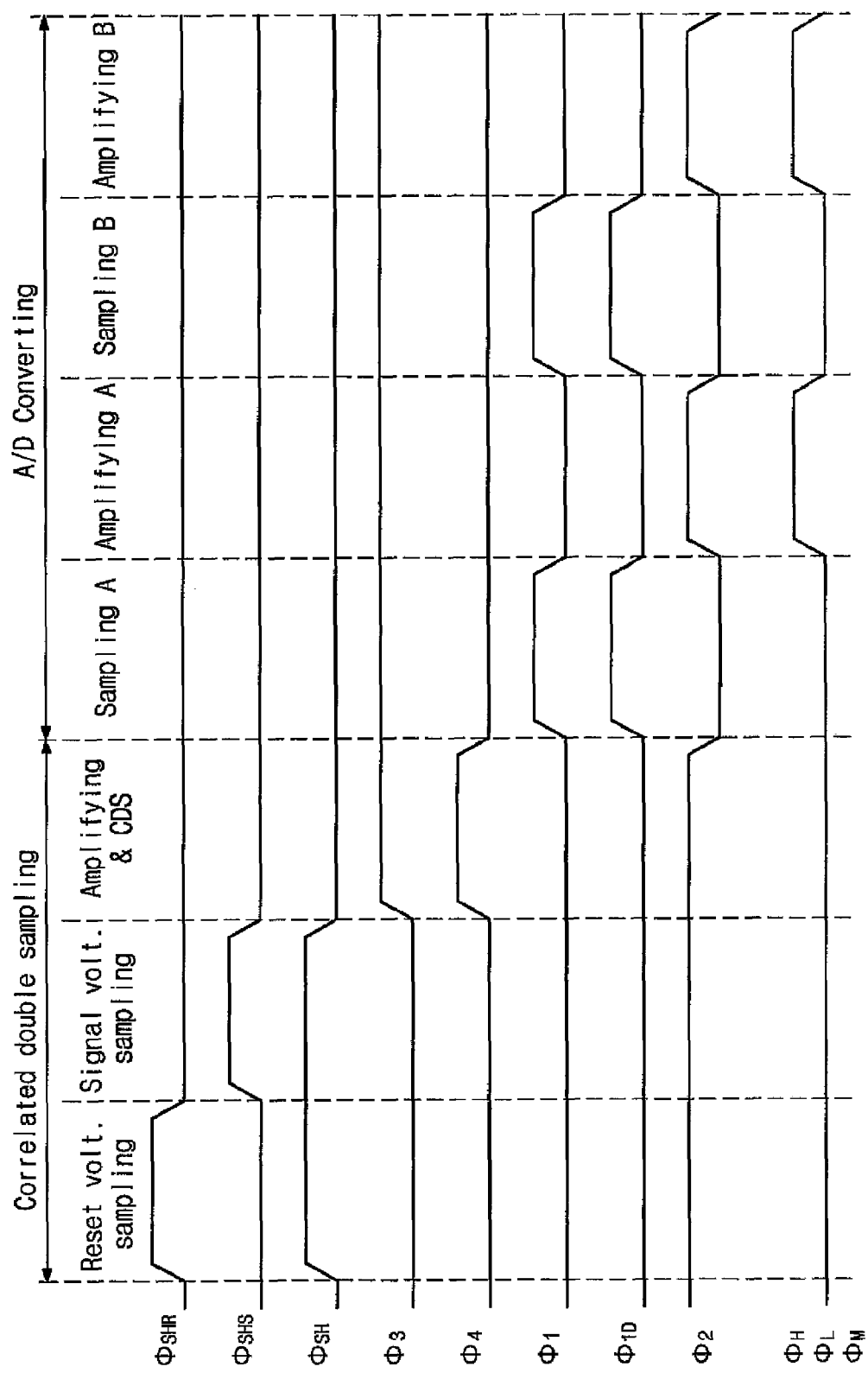
FIG. 4 is an operational timing diagram of the correlated double-sampling circuit shown in FIG. 3, according to an embodiment of the present invention.

FIG. 4 is an operational timing diagram of the CDS circuit 31 shown in FIG. 3.

The timing diagram of the switches $\phi_H$, $\phi_L$, and $\phi_M$, shown in FIG. 4, illustrates on/off conditions of the switches controlled by the DAC 35. The switches, $\phi_H$, $\phi_L$, and $\phi_M$, are turned off in low (L) level periods. In high (H) level periods, only a selective one of the switches $\phi_H$, $\phi_L$, and $\phi_M$ is turned on by the DAC 35.

The CDS circuit 31 samples and amplifies the reset and signal voltages Vrst and Vsig in a CDS period. The CDS circuit 31 also performs sampling and amplifying operations during an ADC period. The CDS circuit 31 may be referred to as a double amplifier in the ADC period.

Figure 5:
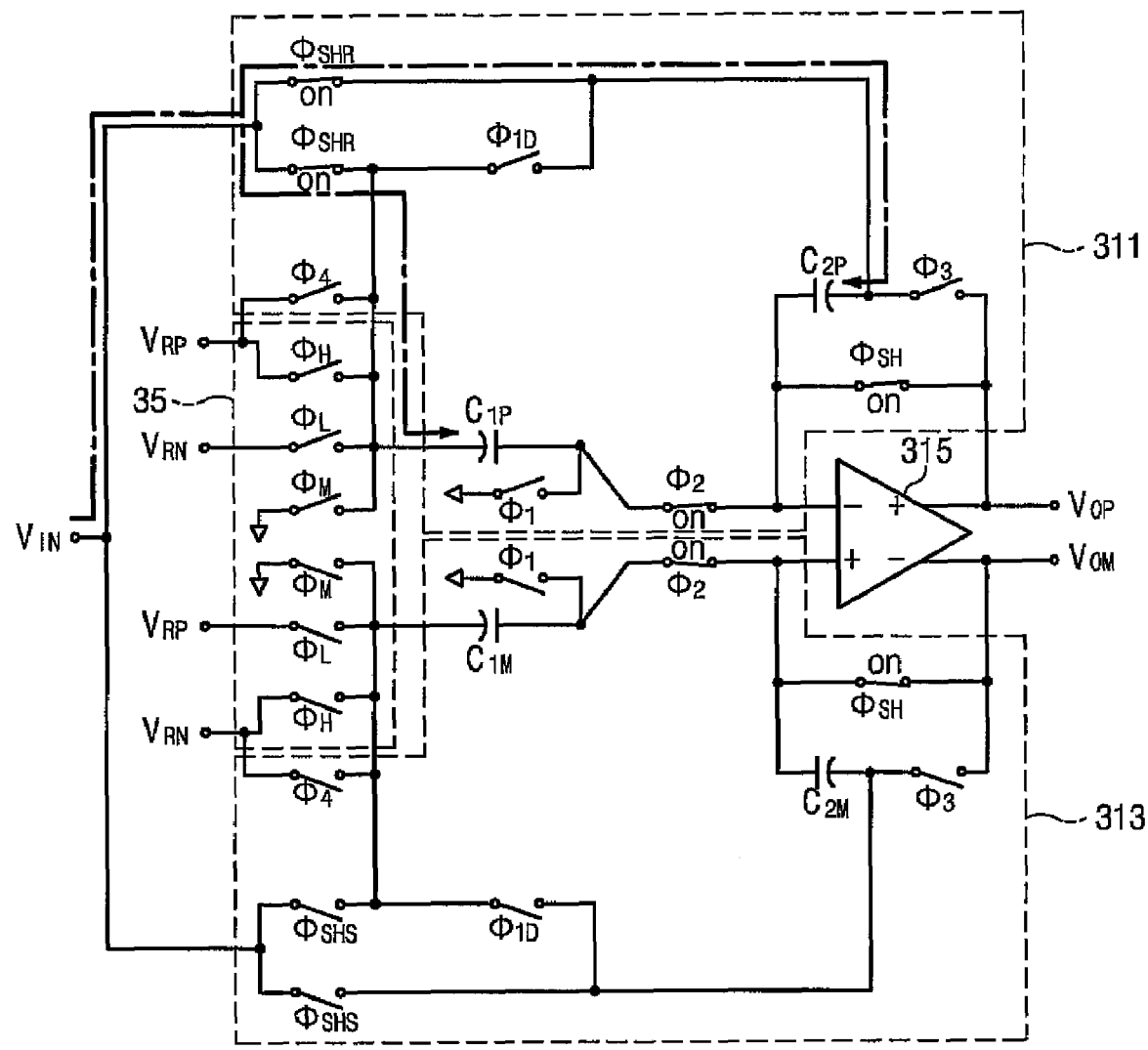
FIG. 5 is a circuit diagram showing a switching feature of a reset voltage sampling operation in the correlated double-sampling circuit shown in FIG. 3, according to an embodiment of the present invention.

FIG. 5 is a circuit diagram showing a switching feature of a reset voltage sampling operation in the CDS circuit shown in FIG. 3. The reset voltage sampling operation of the CDS circuit 31 will now be described with reference to FIGS. 4 and 5.

Referring to the timing diagram shown in FIG. 4, the switches $\phi_{SHR}$, $\phi_{SH}$, and $\phi_2$ are turned on in a reset voltage sampling step. As illustrated in FIG. 5, one end of the first capacitor $C_{1P}$ is coupled to the input signal $V_{IN}$ (through the switch $\phi_{SHR}$). The other end of the first capacitor $C_{1P}$ is coupled to the inverted input terminal of the differential amplifier 315 and one end of the second capacitor $C_{2P}$ (through the switch $\phi_2$), and to a non-inverted output terminal of the differential amplifier 315 (through the switch $\phi_{SH}$). The other end of the second capacitor $C_{2P}$ is coupled to the input signal $V_{IN}$ through the switch $\phi_{SHR}$.

In the reset voltage sampling step, the input signal $V_{IN}$ applied to the CDS circuit 31 is the reset voltage Vrst. The CDS circuit 31 provides the reset voltage Vrst to the first CDS circuit 311. The reset voltage Vrst is sampled by the first and second capacitors $C_{1P}$ and $C_{2P}$ through the switch $\phi_{SHR}$ that is turned on. In other words, the reset voltage Vrst is charged in the first and second capacitors $C_{1P}$ and $C_{2P}$.

Charges Q1 and Q2 accumulated each in the first and second capacitors $C_{1P}$ and $C_{2P}$ are represented as $Q1=C_{1P} \cdot Vrst$ and $Q2=C_{2P} \cdot Vrst$, respectively.

Figure 6:
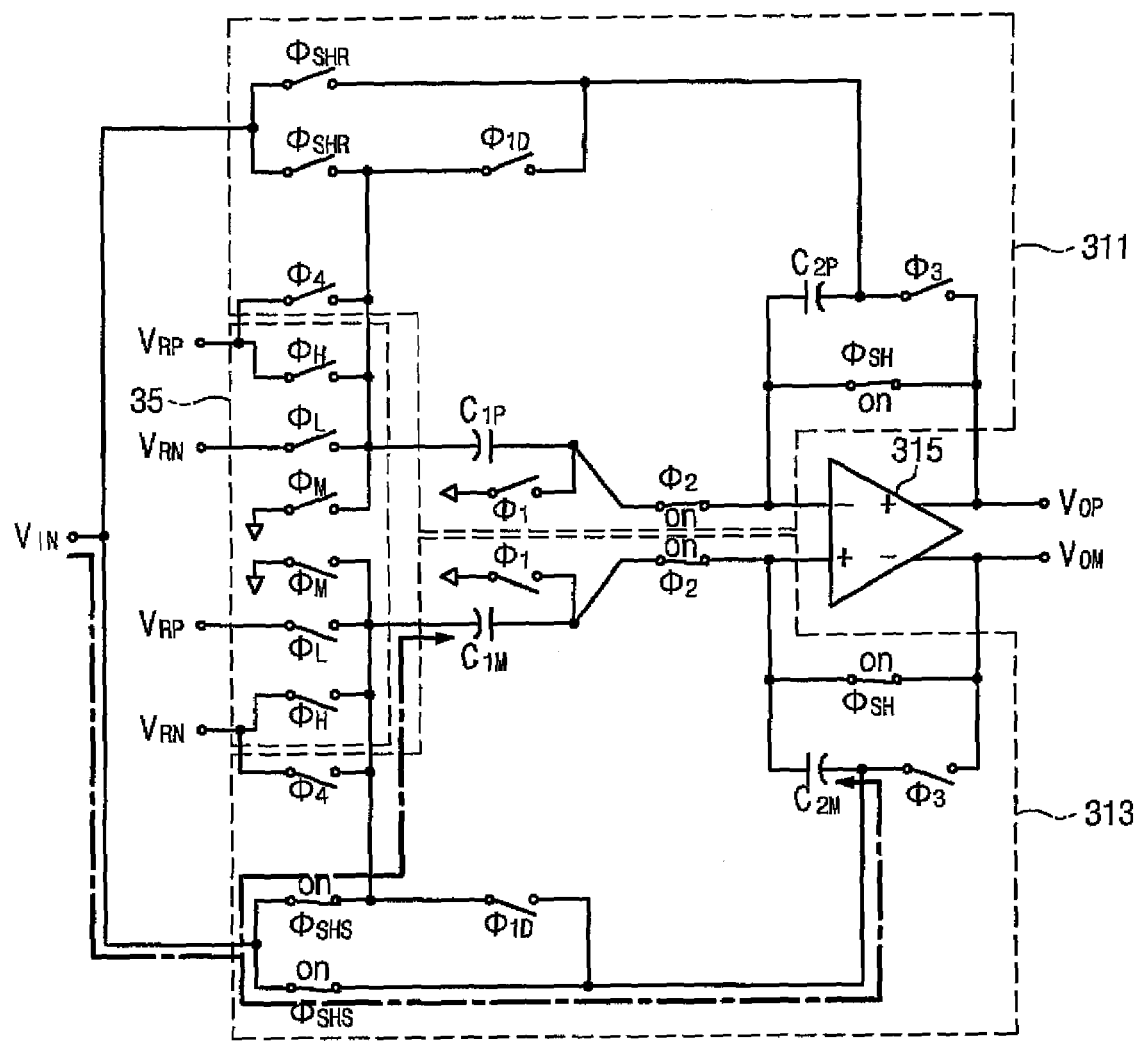
FIG. 6 is a circuit diagram showing a switching feature of a signal voltage sampling operation in the correlated double-sampling circuit shown in FIG. 3, according to an embodiment of the present invention.

FIG. 6 is a circuit diagram showing a switching feature of a signal voltage sampling operation in the CDS circuit shown in FIG. 3. The signal voltage sampling operation of the CDS circuit 31 will now be described with reference to FIGS. 4 and 6.

Referring to the timing diagram shown in FIG. 4, the switches $\phi_{SHS}$, $\phi_{SH}$, and $\phi_2$ are turned on in a signal voltage sampling step. As illustrated in FIG. 6, one end of the third capacitor $C_{1M}$ is coupled to the input signal $V_{IN}$ (through the switch $\phi_{SHS}$). The other end of the third capacitor $C_{1M}$ is coupled to the non-inverted input terminal of the differential amplifier 315 and one end of the fourth capacitor $C_{2M}$ (through the switch $\phi_2$), and to an inverted output terminal of the differential amplifier 315 (through the switch $\phi_{SH}$). The other end of the fourth capacitor $C_{2M}$ is coupled to the input signal $V_{IN}$ through the switch $\phi_{SHS}$.

In the signal voltage sampling step, the input signal $V_{IN}$ applied to the CDS circuit 31 is the signal voltage Vsig. The CDS circuit 31 provides the signal voltage Vsig to the second CDS circuit 313. The signal voltage Vsig is sampled by the third and fourth capacitors $C_{1M}$ and $C_{2M}$ through the switch $\phi_{SHS}$ that is turned on. In other words, the signal voltage Vsig is charged in the third and fourth capacitors $C_{1M}$ and $C_{2M}$.

Charges Q3 and Q4 accumulated each in the first and second capacitors $C_{1M}$ and $C_{2M}$ are represented as $Q3=C_{1M} \cdot Vsig$ and $Q4=C_{2M} \cdot Vsig$, respectively.

Figure 7:
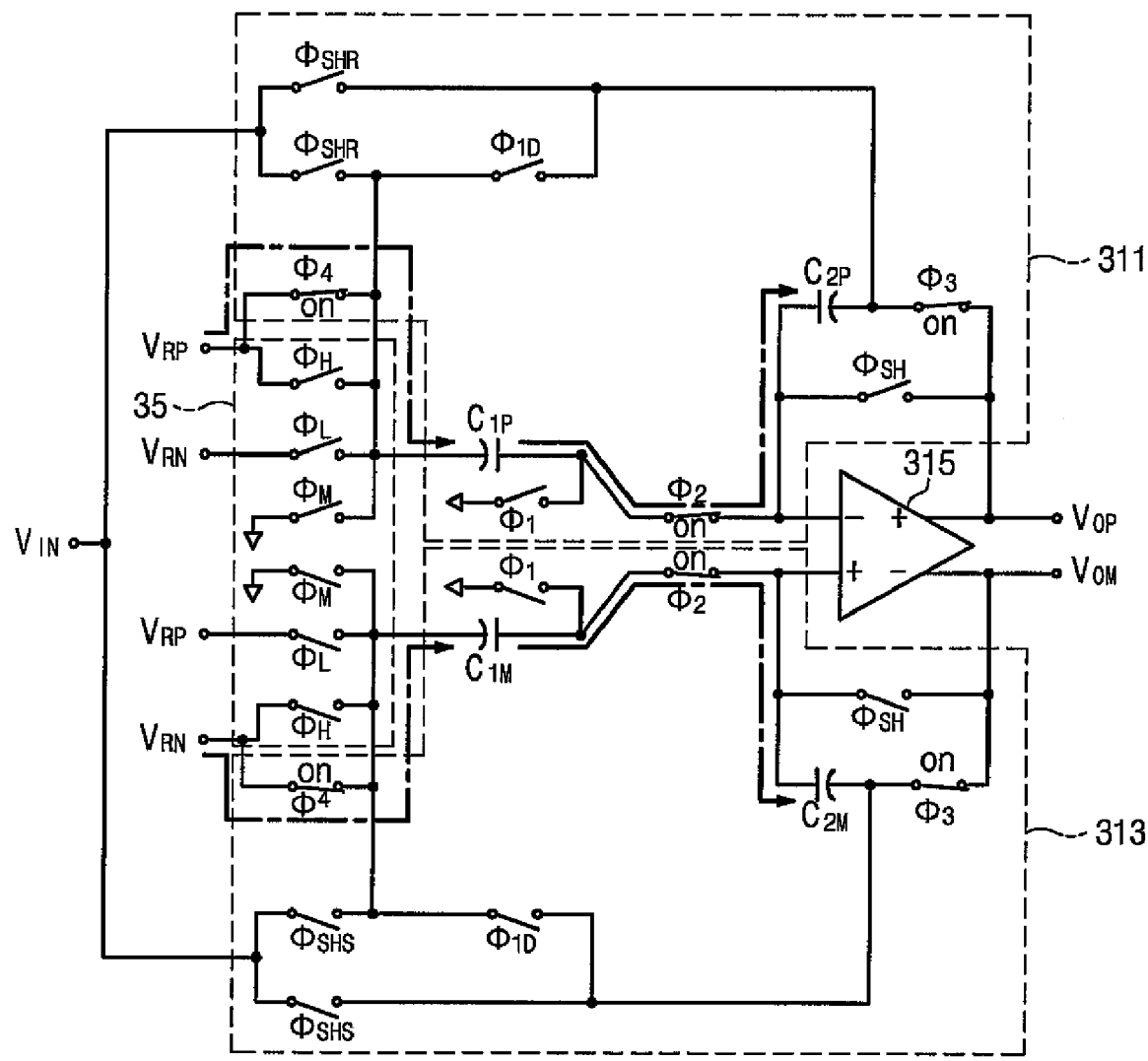
FIG. 7 is a circuit diagram showing an amplifying operation of sampled reset and signal voltages in the correlated double-sampling circuit shown in FIG. 3, according to an embodiment of the present invention.

FIG. 7 is a circuit diagram showing the amplifying operation of the sampled reset and signal voltages in the CDS circuit shown in FIG. 3. The amplifying operation of the sampled reset and signal voltages in the CDS circuit 31 will now be described with reference to FIGS. 4 and 7.

Referring to the timing diagram shown in FIG. 4, since the switches $\phi_{SHR}$ and $\phi_{SHS}$ are turned off in an amplifying & CDS step of the sampled reset and signal voltages, the input signal $V_{IN}$ is interrupted and the switches $\phi_2$, $\phi_3$, and $\phi_4$ are turned on. Thus, as illustrated in FIG. 6, one end of the first capacitor $C_{1P}$ is coupled to the first reference voltage $V_{RP}$ (Vref) through the switch $\phi_4$. The other end of the first capacitor $C_{1P}$ is connected to the inverted input terminal of the differential amplifier 315 and one end of the second capacitor $C_{2P}$ (through the switch $\phi_2$). The other end of the second capacitor $C_{2P}$ is connected to the non-inverted output terminal of the differential amplifier 315 through the switch $\phi_3$. The second capacitor $C_{2P}$ forms a feedback loop of the differential amplifier 315.

One end of the third capacitor $C_{1M}$ is coupled to the second reference voltage $V_{RN}$ (−Vref) through the switch $\phi_4$. The other end of the third capacitor $C_{1M}$ is connected to the non-inverted input terminal of the differential amplifier 315 and one end of the fourth capacitor $C_{2M}$ (through the switch $\phi_2$). The other end of the fourth capacitor $C_{2M}$ is connected to the inverted output terminal of the differential amplifier 315 through the switch $\phi_3$. The fourth capacitor $C_{2M}$ forms a feedback loop of the differential amplifier 315.

In this configuration, the first CDS circuit 311 receives the first reference voltage $V_{RP}$ and the second CDS circuit 313 receives the second reference voltage $V_{RN}$. Thus, charge amounts accumulated in the first and third capacitors $C_{1P}$ and $C_{1M}$ are varied by the first and second reference voltages $V_{RP}$ and $V_{RN}$, respectively. In detail, a variation of charges at the first capacitor $C_{1P}$, $\Delta Q1$, becomes $\Delta Q1=C_{1P}(Vrst-V_{RP})$. This variation is transferred into the second capacitor $C_{2P}$. As a result, the final value of the sampled reset voltage Vrst becomes Vout $(01)=(Q2+\Delta Q1)/C_{2P}=(C_{1P}(Vrst-V_{RP})+C_{2P} \cdot Vrst)/C_{2P}$. As the first and second capacitors $C_{1P}$ and $C_{2P}$ have the same capacitance values, the final output Vout (01) of the sampled reset voltage Vrst is given by Equation 2.

$$Vout(01)=2Vrst-V_{RP} \quad \text{[Equation 2]}$$

Hence, the first CDS circuit 311 samples the reset voltage Vrst and amplifies the sampled reset voltage Vrst by a factor of two. Further, the first CDS circuit 311 subtracts the first reference voltage $V_{RP}$ from the amplified reset voltage.

A variation of charges at the third capacitor $C_{1M}$, $\Delta Q3$, becomes $\Delta Q3=C_{1M}(Vsig-V_{RN})$. This variation is transferred into the fourth capacitor $C_{2M}$. As a result, the final value of the sampled signal voltage Vsig becomes Vout $(02)=(Q4+\Delta Q3)/C_{2M} \times (C_{1M}(Vsig-V_{RN})+C_{2M} \cdot Vsig)/C_{2M}$. As the third and fourth capacitors $C_{1M}$ and $C_{2M}$ have the same capacitance value, the final output Vout (02) of the sampled signal voltage Vsig is given by Equation 3.

$$Vout(02)=2Vsig-V_{RN} \quad \text{[Equation 3]}$$

Hence, the second CDS circuit 313 samples the signal voltage Vsig and amplifies the sampled signal voltage Vsig by a factor of two. Further, the second CDS circuit 313 subtracts the second reference voltage $V_{RN}$ from the amplified signal voltage.

The differential amplifier 315 outputs a difference between the outputs Vout (01) and Vout (02) of the first and second CDS circuits 311 and 313. Thus, a signal Vout (0) output from the CDS circuit 31 becomes Vout (0)=2Vrst-$V_{RP}$-(2Vsig-$V_{RN}$) as follows.

$$Vout(0)=2(Vrst-Vsig)-(V_{RP}-V_{RN}) \qquad \text{[Equation 4]}$$

The output signal Vout (0) means the first output signal of the CDS circuit 31. The first output signal Vout (0) is generated from processing the input reset and signal voltages Vrst and Vsig in the CDS mode.

Referring to Equation 4, the CDS circuit 31 amplifies a difference between the input reset and signal voltage Vrst and Vsig by a factor of two. Further, the CDS circuit 31 subtracts a difference between the first and second reference voltages $V_{RP}$ and $V_{RN}$ from the amplified difference signal.

The CDS circuit 31 samples the reset voltage Vrst through the first and second capacitors $C_{1P}$ and $C_{2P}$ of the first CDS circuit 311, and amplifies the sampled reset voltage Vrst. The CDS circuit 31 also samples the signal voltage Vsig through the third and fourth capacitors $C_{1M}$ and $C_{2M}$ of the second CDS circuit 313, and amplifies the sampled signal voltage Vsig. Therefore, since the CDS circuit 31 according to embodiments of the invention uses only four capacitors $C_{1P}$, $C_{2P}$, $C_{1M}$, and $C_{2M}$ for sampling and amplifying the input signal $V_{IN}$, it is able to reduce the chip area of the CMOS image sensor. In addition, as the CDS circuit 31 samples and amplifies the reset and signal voltages Vrst and Vsig through the first and second CDS circuits 311 and 313, it is efficient in conducting the CDS process.

The output signal Vout from the CDS circuit 31 includes output signals $V_{OP}$ and $V_{OM}$ that are contrary to each other in phase but the same in amplitude.

The input signal $V_{IN}$ is processed by the CDS circuit 31 in the CDS mode and converted into a digital signal D. The converted digital signal D is provided to an external storage unit (not shown) and the DAC 35. The DAC 35 selects the first reference voltage $V_{RP}$, the second reference voltage $V_{RN}$, or the third reference voltages GND in response to the digital signal D.

Figure 8:
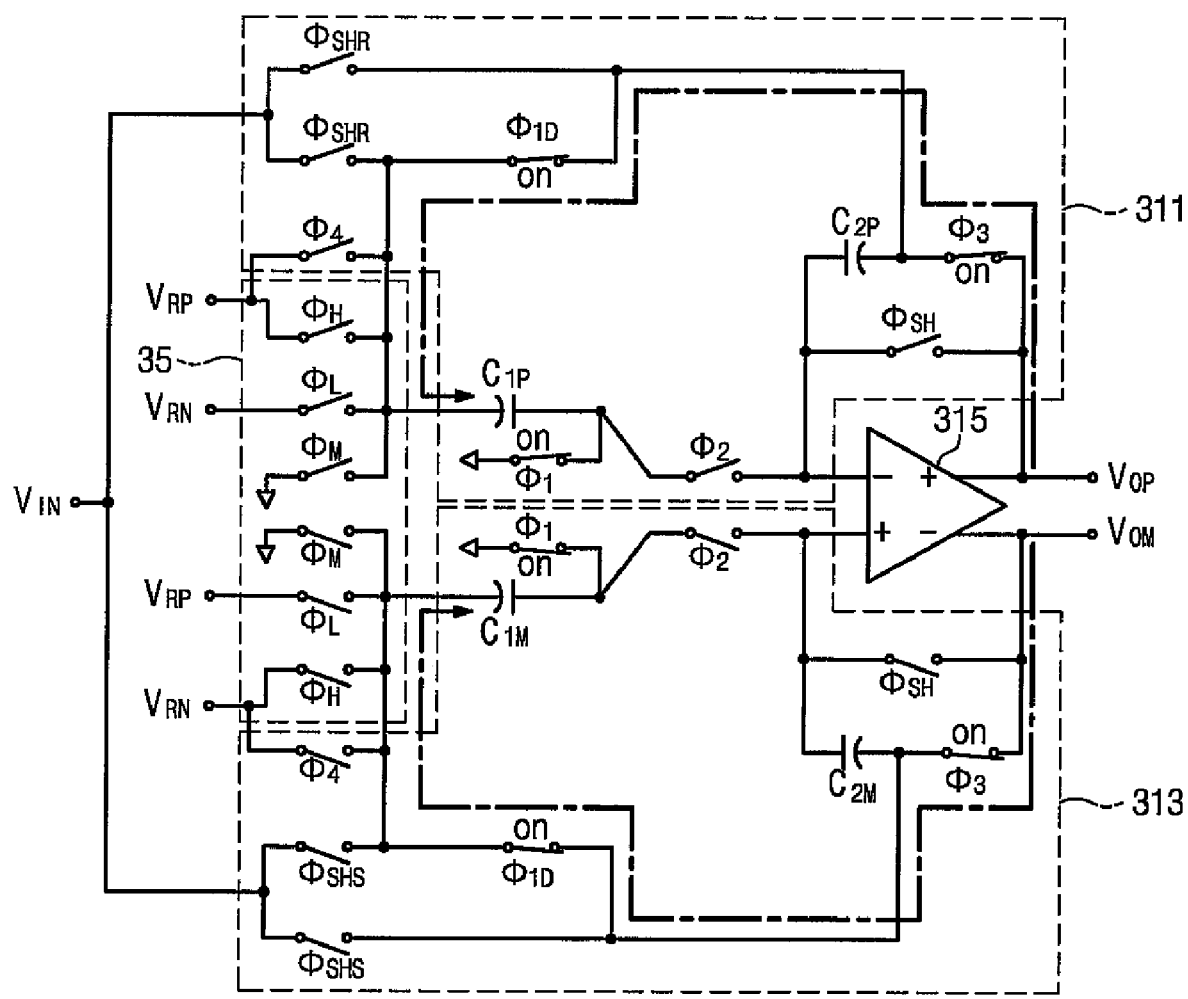
FIG. 8 is a circuit diagram showing a switching feature of a sampling operation with the first output signal in the correlated double-sampling circuit shown in FIG. 3, according to an embodiment of the present invention.

FIG. 8 is a circuit diagram showing a switching feature of a sampling operation with the first output signal in the CDS circuit shown in FIG. 3. The sampling operation with the first output signal will now be described with reference to FIGS. 4 and 8.

The second and fourth capacitors, $C_{2P}$ and $C_{2M}$, hold the first output signal Vout (0) that is generated from the amplifying & CDS step with the sampled reset and signal voltages Vrst and Vsig. The first output signal of the first CDS circuit 311 is Vout (01)=2Vrst-$V_{RP}$ and the first output signal of the second CDS circuit 313 is Vout (02)=2Vsig-$V_{RN}$. Thus, in the Sampling A step shown in FIG. 4, the charge amount Q2 of the second capacitor $C_{2P}$ is Q2=$C_{2P}$ (Vout (01)) and the charge amount Q4 of the fourth capacitor $C_{2M}$ is Q4=$C_{2M}$ (Vout (02)).

Referring to the timing diagram of FIG. 4, the switches $\phi_3$, $\phi_1$, and $\phi_{1D}$ are turned on in the Sampling A step. Thus, one end of the first capacitor $C_{1P}$ of the first CDS circuit 311 is connected to one end of the second capacitor $C_{2P}$ through the switch $\phi_{1D}$ and, through the switches $\phi_{1D}$ and $\phi_3$, to the non-inverted output terminal of the differential amplifier 315. The other end of the first capacitor $C_{1P}$ is coupled to the ground voltage GND through the switch $\phi_1$. The other end of the second capacitor $C_{2P}$ is connected to the inverted input terminal of the differential amplifier 315. The second capacitor $C_{2P}$ forms a feedback loop of the differential amplifier 315.

One end of the third capacitor $C_{1M}$ of the second CDS circuit 313 is connected to one end of the fourth capacitor $C_{2M}$ through the switch $\phi_{1D}$ and, through the switches $\phi_{1D}$ and $\phi_3$, to the inverted output terminal of the differential amplifier 315. The other end of the third capacitor $C_{1M}$ is coupled to the ground voltage GND through the switch $\phi_1$. The other end of the fourth capacitor $C_{2M}$ is connected to the non-inverted input terminal of the differential amplifier 315. The fourth capacitor $C_{2M}$ forms a feedback loop of the differential amplifier 315.

In this configuration, the first output signal Vout (0) is charged in the first and second capacitors $C_{1P}$ and $C_{1M}$. The first output signal of the first CDS circuit 311, Vout (01) =2Vrst-$V_{RP}$, is charged in the first capacitor $C_{1P}$, while the first output signal of the second CDS circuit 313, Vout (02) =2Vsig-$V_{RN}$, is charged in the third capacitor $C_{1M}$. Therefore, the charge amount Q1 accumulated in the first capacitor $C_{1P}$ is Q1=$C_{1P}$ (Vout (01)) and the charge amount Q3 accumulated in the third capacitor $C_{1M}$ is Q3=$C_{1M}$ (Vout (02)).

Figure 9:
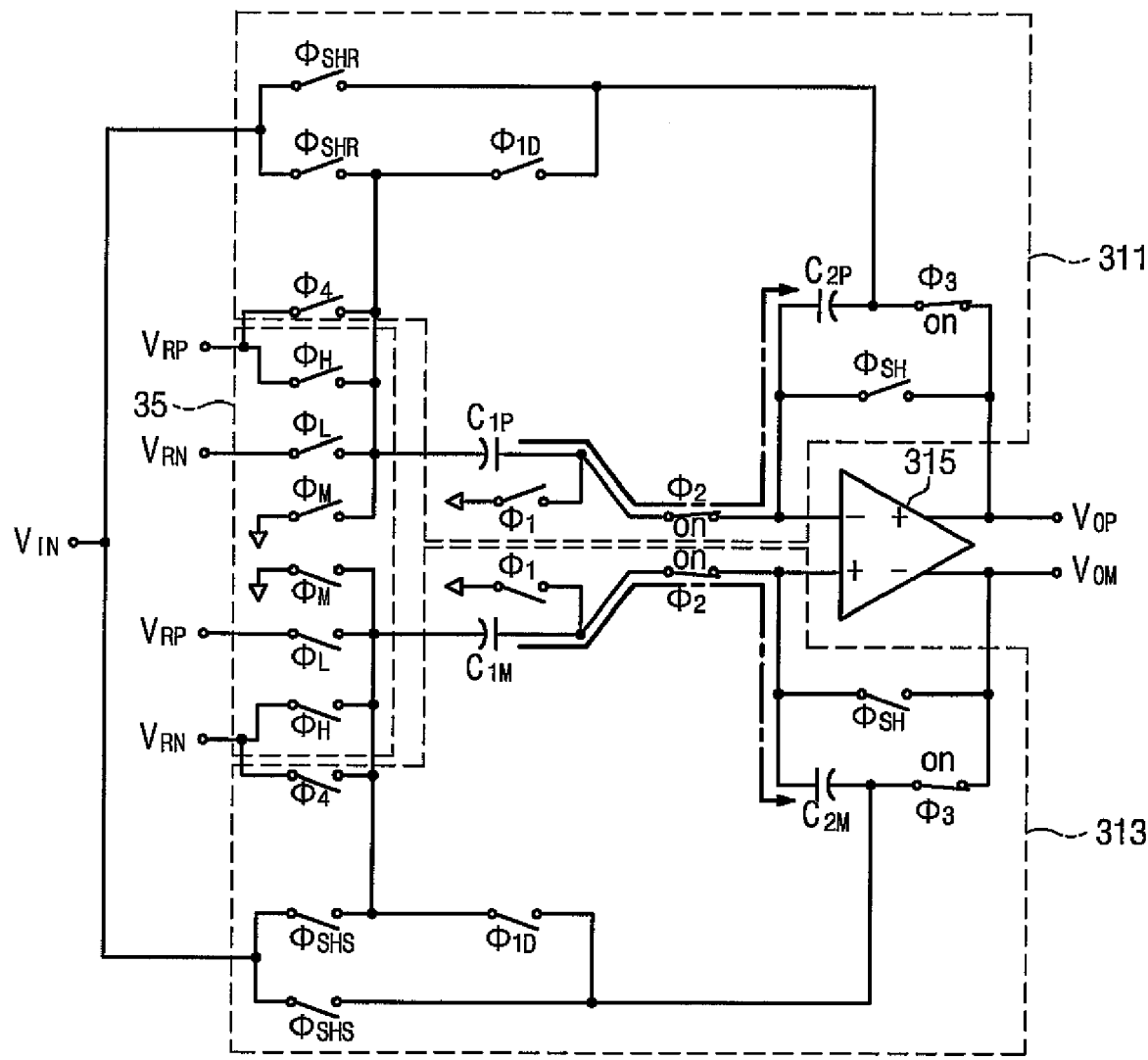
FIG. 9 is a circuit diagram showing a switching feature of an amplifying operation with the first output signal in the correlated double-sampling circuit shown in FIG. 3, according to an embodiment of the present invention.

FIG. 9 is a circuit diagram showing a switching feature of an amplifying operation with the first output signal in the CDS circuit shown in FIG. 3.

Referring to the timing diagram shown in FIG. 4, the switches $\phi_3$ and $\phi_2$ are turned on in the Amplifying A step. In addition, the switches for supplying the reference voltages, as selected by the DAC 35, are also selectively activated.

The DAC 35 turns on the switches $\phi_H$, $\phi_L$, and $\phi_M$ in response to the digital values D1 and D0 output from the comparator 33 using an internal control logic unit (not shown). For instance, if the digital signals (i.e., the digital values) of the comparator 33 are D1=1 and D0=0, the DAC 35 turns the switch $\phi_H$ on. In this instance, the first CDS circuit 311 receives the first reference voltage $V_{RP}$ and the second CDS circuit 313 receives the second reference voltage $V_{RN}$. If the digital signals of the comparator 33 are D1=0 and D0=1, the DAC 35 turns the switch $\phi_L$ on. In this case, the first CDS circuit 311 receives the second reference voltage $V_{RN}$ and the second CDS circuit 313 receives the first reference voltage $V_{RP}$. If the digital signals of the comparator 33 are D1=0 and D0=0, the DAC 35 turns the switch $\phi_M$ on. In this instance, both the first and second CDS circuits 311 and 313 receive the ground voltage GND.

As the switches $\phi_3$ and $\phi_2$ are turned on, one end of the first capacitor $C_{1P}$ of the first CDS circuit 311 is coupled to the reference voltage selected by the DAC 35. The other end of the first capacitor $C_{1P}$ is connected to the inverted input terminal of the differential amplifier 315 and one end of the second capacitor $C_{2P}$ through the switch $\phi_2$. The other end of the second capacitor $C_{2P}$ is connected to the non-inverted output terminal of the differential amplifier 315. The second capacitor $C_{2P}$ forms a feedback loop of the differential amplifier 315.

In addition, when the switches $\phi_3$ and $\phi_2$ are turned on, one end of the third capacitor $C_{1M}$ of the second CDS circuit 313 is coupled to the reference voltage selected by the DAC 35. The other end of the third capacitor $C_{1M}$ is connected to the non-inverted input terminal of the differential amplifier 315 and one end of the fourth capacitor $C_{2M}$ through the switch $\phi_2$. The other end of the fourth capacitor $C_{2M}$ is connected to the inverted output terminal of the differential amplifier 315. The fourth capacitor $C_{2M}$ forms a feedback loop of the differential amplifier 315.

With this configuration, charge amounts accumulated in the first and third capacitors $C_{1P}$ and $C_{1M}$ are varied by the reference voltages selected by the DAC 35. For instance, if the DAC 35 turns switch $\phi_H$ on, then the first reference voltage $V_{RP}$ is applied to the first CDS circuit 311 and the second reference voltage $V_{RN}$ is applied to the second CDS circuit 313.

When the first and second reference voltages $V_{RP}$ and $V_{RN}$ are applied, the variation $\Delta Q1$ of charges accumulated in the first capacitor $C_{1P}$ becomes $\Delta Q1 = C_{1P}(\text{Vout } (01) - V_{RP})$ and the variation $\Delta Q2$ of charges accumulated in the third capacitor $C_{1M}$ becomes $\Delta Q2 = C_{1M}(\text{Vout } (02) - V_{RN})$. The charge variation $\Delta Q1$ is transferred to the second capacitor $C_{2P}$ and the charge variation $\Delta Q2$ is transferred to the fourth capacitor $C_{2M}$.

Therefore, the final output of the first CDS circuit 311 becomes Vout $(11) = (Q2 + \Delta Q1)/C_{2P} = (C_{1P}(\text{Vout } (01) - V_{RP}) + C_{2P} \cdot \text{Vout } (01))/C_{2P}$. As the first and second capacitors $C_{1P}$ and $C_{2P}$ have the same capacitance value, the final output Vout (11) of the first CDS circuit 311 is given by Equation 5.

$$\text{Vout}(11) = 2\text{Vout}(01) - V_{RP} \quad \text{[Equation 5]}$$

The final output of the second CDS circuit 313 becomes Vout $(12) = (Q4 + \Delta Q3)/C_{2M} = (C_{1M}(\text{Vout } (02) - V_{RN}) + C_{2M} \cdot \text{Vout } (02))/C_{2M}$. As the third and fourth capacitors $C_{1M}$ and $C_{2M}$ have the same capacitance value, the final output Vout (12) of the second CDS circuit 313 is given by Equation 6.

$$\text{Vout}(12) = 2\text{Vout}(02) - V_{RN} \quad \text{[Equation 6]}$$

Therefore, the first CDS circuit 311 receives the output signal Vout (01), which is output from the amplifying & CDS step with the sampled reset and signal voltages Vrst and Vsig, by way of the feedback loop, and samples the output signal Vout (01). The first CDS circuit 311 amplifies the sampled signal Vout (01) by a factor of two. The first VDS circuit 311 then subtracts the first reference voltage $V_{RP}$, which is selected by the DAC 35, from the amplified signal Vout (01).

Meanwhile, the second CDS circuit 313 receives the output signal Vout (02), which is output from the amplifying & CDS step with the sampled reset and signal voltages Vrst and Vsig, by way of the feedback loop, and samples the output signal Vout (02). The second CDS circuit 313 amplifies the sampled signal Vout (02) by a factor of two. Then, the second CDS circuit 313 subtracts the second reference voltage $V_{RN}$, which is selected by the DAC 35, from the amplified signal Vout (02).

The differential amplifier 31 outputs a difference between the first and second CDS circuits 311 and 313. Hence, a signal output from the CDS circuit 31 becomes Vout $(1) = 2\text{Vout}(01) - V_{RP} - (2\text{Vout}(02) - V_{RN})$ as follows.

$$\text{Vout}(1) = 2(\text{Vout}(0)) - (V_{RP} - V_{RN}) \quad \text{[Equation 7]}$$

The output signal Vout (1) means a second output signal of the CDS circuit 31. The second output signal Vout (1) is obtained by sampling the first output signal Vout (0) input to the CDS circuit 31 through the feedback loop, amplifying the sampled first output signal Vout (0), and subtracting the reference voltage selected by the DAC 35 from the amplified first output signal Vout (0).

The secondary sampling and amplifying steps (Sampling B and Amplifying B) shown in FIG. 4 are performed the same as the Sampling A and Amplifying A steps, and so will not be described in detail. The ADC 30 repeats the sampling and amplifying operations through the CDS circuit 31 after inputting the reset and signal voltages Vrst and Vsig. If the number of bits of an external storage unit for storing the digital signals output from the comparator 33 is N+1, the sampling and amplifying operations of the CDS circuit 31 is repeated in N cycle times.

In summary, the ADC 30 samples the reset voltage Vrst through the first and second capacitors $C_{1P}$ and $C_{2P}$ of the first CDS circuit 311, and amplifies the sampled reset voltage Vrst by a factor of two. The ADC 30 also samples the signal voltage Vsig through the third and fourth capacitors $C_{1M}$ and $C_{2M}$ of the second CDS circuit 313, and amplifies the sampled signal voltage Vsig by a factor of two. The first CDS circuit 311 subtracts the first reference voltage $V_{RP}$ from the amplified reset voltage Vrst and outputs the difference. The second CDS circuit 313 subtracts the second reference voltage $V_{RN}$ from the amplified signal voltage Vsig and outputs the difference. Then, the differential amplifier 315 outputs a difference between outputs of the first and second CDS circuits 311 and 313.

Hence, since the ADC 30 according to the present invention uses the four capacitors in sampling and amplifying the input signal $V_{IN}$, it is able to reduce the chip area of the CMOS image sensor. Additionally, as the ADC 30 samples and amplifies the reset and signal voltages Vrst and Vsig through the first and second CDS circuits 311 and 313 of the CDS circuit 31, corresponding respectively thereto, it is efficient in conducting the CDS process.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An analog-to-digital converter (ADC) comprising:
   a first circuit configured to sample a reset voltage, amplify the sampled reset voltage, and subtract a first reference voltage from the amplified reset voltage to produce a first difference;
   a second circuit configured to sample a signal voltage, amplify the sampled signal voltage, and subtract a second reference voltage from the amplified signal voltage to produce a second difference;
   a differential amplifier coupled to the first circuit and the second circuit, the differential amplifier configured to produce a third difference based on a comparison of the first difference and the second difference;
   a comparator coupled to the differential amplifier, the comparator configured to compare an output of the differential amplifier with at least one predetermined comparison voltage and output a result of the comparison as a digital value; and
   a digital-to-analog converter (DAC) coupled to the first circuit, the second circuit, and the comparator, the DAC configured to control the first and second reference voltages in response to the digital value.

2. The ADC as set forth in claim 1, wherein the first and second reference voltages are equal in amplitude, but different in phase.

3. The ADC as set forth in claim 1, wherein the first and second circuits are configured to receive outputs of the first and second circuits, respectively, through feedback loops.

4. The ADC as set forth in claim 3, wherein the first circuit is configured to sample and amplify the received output of the first circuit to produce a first result, and wherein the second circuit is configured to sample and amplify the received output of the second circuit to produce a second result.

5. The ADC as set forth in claim 4, wherein the first circuit is configured to subtract a first selected voltage from the first result to produce a fourth difference, the first selected voltage being one of the first reference voltage, the second reference voltage, and a ground voltage, and wherein the second circuit is configured to subtract a second selected voltage, from the second result to produce a fifth difference, the second selected voltage being one of the first reference voltage, the second reference voltage and the ground voltage, the DAC being configured to determine the first selected voltage and the second selected voltage.

6. The ADC as set forth in claim 5, wherein the differential amplifier is configured to produce a sixth difference based on a comparison of the fourth difference and the fifth difference.

7. The ADC as set forth in claim 5, wherein the DAC is configured such that if the first selected voltage is the first reference voltage, then the second selected voltage is the second reference voltage.

8. The ADC as set forth in claim 5, wherein the DAC is configured such that if the first selected voltage is the second reference voltage, then the second selected voltage is the first reference voltage.

9. The ADC as set forth in claim 5, wherein the DAC is configured such that if the first selected voltage is the ground voltage, then the second selected voltage is the ground voltage.

10. The ADC as set forth in claim 1, wherein the first circuit includes exactly two capacitors.

11. The ADC as set forth in claim 1, wherein the first circuit is configured to amplify the sampled reset voltage by a factor of two.

12. The ADC as set forth in claim 1, wherein the second circuit includes exactly two capacitors.

13. The ADC as set forth in claim 1, wherein the second circuit is configured to amplify the sampled reset voltage by a factor of two.

14. A correlated double-sampling (CDS) circuit comprising:

a first circuit configured to sample a reset voltage, amplify the sampled reset voltage by a factor of two, and subtract a first reference voltage from the amplified reset voltage to produce a first difference;
   a second circuit configured to sample a signal voltage, amplify the sampled signal voltage by a factor of two, and subtract a second reference voltage from the amplified signal voltage to produce a second difference; and
   a differential amplifier coupled to the first circuit and the second circuit, the differential amplifier configured to produce a third difference based on a comparison of the first difference and the second difference.

15. The CDS circuit as set forth in claim 14, wherein the first and second reference voltages are equal in amplitude, but different in phase.

16. The CDS circuit as set forth in claim 15, wherein the first circuit includes first and second capacitors, the first circuit configured to sample the reset voltage through the first and second capacitors.

17. The CDS circuit as set forth in claim 16, wherein the first circuit is further configured to disconnect from a reset voltage input after sampling the reset voltage and before amplifying the sampled reset voltage.

18. The CDS circuit as set forth in claim 17, wherein the first circuit is configured to receive the first difference.

19. The CDS circuit as set forth in claim 17, wherein the second circuit includes third and fourth capacitors, the second circuit being further configured to sample the signal voltage through the third and fourth capacitors.

20. The CDS circuit as set forth in claim 19, wherein the second circuit is further configured to disconnect from a signal voltage input after sampling the signal voltage and before amplifying the sampled signal voltage.

21. The CDS circuit as set forth in claim 20, wherein the second circuit is configured to receive the second difference.

* * * * *